United States Patent
Zhou

(10) Patent No.: US 10,216,049 B2
(45) Date of Patent: Feb. 26, 2019

(54) DISPLAY PANEL AND DISPLAY DEVICE

(71) Applicant: Xiamen Tianma Micro-Electronics Co., Ltd., Xiamen (CN)

(72) Inventor: Hongbo Zhou, Xiamen (CN)

(73) Assignee: XIAMEN TIANMA MICRO-ELECTRONICS CO., LTD. (CN)

( * ) Notice: Subject to any disclaimer, the term of this patent is extended or adjusted under 35 U.S.C. 154(b) by 0 days.

(21) Appl. No.: 15/798,840

(22) Filed: Oct. 31, 2017

(65) Prior Publication Data

US 2018/0341157 A1 Nov. 29, 2018

(30) Foreign Application Priority Data

May 26, 2017 (CN) .......................... 2017 1 0382475

(51) Int. Cl.
- *H01L 27/12* (2006.01)
- *G02F 1/1333* (2006.01)
- *G02F 1/1343* (2006.01)
- *G02F 1/1362* (2006.01)
- *G02F 1/1368* (2006.01)

(52) U.S. Cl.
CPC ...... *G02F 1/134336* (2013.01); *G02F 1/1368* (2013.01); *G02F 1/13439* (2013.01); *G02F 1/133345* (2013.01); *G02F 1/136227* (2013.01); *H01L 27/124* (2013.01); *H01L 27/1248* (2013.01); *G02F 2001/133357* (2013.01); *G02F 2001/134345* (2013.01); *G02F 2201/121* (2013.01); *G02F 2201/123* (2013.01)

(58) Field of Classification Search
CPC ....... G02F 2001/134345; H01L 27/124; H01L 27/326; H01L 27/3262
See application file for complete search history.

(56) References Cited

U.S. PATENT DOCUMENTS

2017/0227805 A1* 8/2017 Chong .............. G02F 1/133305

* cited by examiner

*Primary Examiner* — Daniel P Shook
(74) *Attorney, Agent, or Firm* — Tarolli, Sundheim, Covell & Tummino LLP

(57) ABSTRACT

Provided are a display panel and a display device. The display panel includes a substrate, a plurality of pixel electrodes on the substrate, and a plurality of thin-film transistors on the substrate; each pixel electrode includes a plurality of first pixel electrodes and at least three second pixel electrodes as compensation pixel electrodes, an area of the substrate occupied by each compensation pixel electrode is less than an area of the substrate occupied by each first pixel electrode; the thin-film transistors are arranged in row in first direction and column in second direction, the thin-film transistors are electrically connected with the pixel electrodes in one-to-one correspondence, and orthographic projection of at least one second pixel electrode on the substrate does not overlap with orthographic projection of at least one thin-film transistor correspondingly connected with the at least one of the at least three second pixel electrodes on the substrate.

18 Claims, 7 Drawing Sheets

DISPLAY PANEL AND DISPLAY DEVICE

CROSS-REFERENCE TO RELATED APPLICATIONS

The present application claims priority to Chinese Patent Application No. 201710382475.5, filed on May 26, 2017, the content of which is incorporated herein by reference in its entirety.

TECHNICAL FIELD

The present disclosure relates to the field of display technologies and, particularly, relates to a display panel and a display device.

BACKGROUND

A display panel is one of the core portions of the display device, the display quality of the display panel will directly affect the performance of the display device, and thus the display quality of the display panel is an important factor to be considered when designing the structural configuration of the display panel.

At present, the display panel mainly includes a plurality of pixels distributed in an array. With the development of the production technology of the display panel, the configuration of the display panel can adapt to various personal needs of users, for example, the display area of the display panel has an arc fillet such that a part of the display area is presented as a special-shaped area, compared to most of the display area of the display panel. A display panel in the conventional art has a special-shaped area, since a complete pixel needs to be kept in the special-shaped area, some areas of the edge of the special-shaped area is not provide with pixel therein, so that the edge of the special-shaped area will present an obvious zigzag display configuration during the display process, which results in poor display quality of the display panel.

SUMMARY

The present disclosure provides a display panel and a display device, to improve the display quality of the display panel.

The first aspect of the present disclosure provides a display panel, including: a substrate; a plurality of pixel electrodes placed on the substrate, each pixel electrode including a plurality of first pixel electrodes and at least three second pixel electrodes; and a plurality of thin-film transistors arranged in rows in a first direction and in columns in a second direction on the substrate; wherein the at least three second pixel electrodes are compensation pixel electrodes, and an area of the substrate occupied by each compensation pixel electrode is smaller than an area of the substrate occupied by each first pixel electrode; and wherein the plurality of thin-film transistors is electrically connected with the plurality of pixel electrodes in one-to-one correspondence, and an orthographic projection of at least one of the at least three second pixel electrodes on the substrate does not overlap with an orthographic projection of at least one of the thin-film transistors correspondingly connected with the at least one of the at least three second pixel electrodes on the substrate.

The second aspect of the present disclosure provides a display device, including the display panel as described above.

BRIEF DESCRIPTION OF DRAWINGS

In order to more clearly illustrate technical solutions in embodiments of the present disclosure, the accompanying drawings used in the embodiments are briefly introduced as follows. It should be noted that, the drawings described as follows are merely used for illustrating the embodiments of the present disclosure, and other drawings can also be acquired by those skilled in the art without paying creative efforts.

The drawings herein are incorporated in the specification and form a part of the specification, which have shown embodiments of the present disclosure and are used together with the specification to explain the principle of the present disclosure.

DESCRIPTION OF EMBODIMENTS

For better understanding of technical solutions of the present disclosure, embodiments of the present disclosure will be illustrated in detail with reference to the accompanying drawings.

It should be understood that, the described embodiments are only a part of the embodiments, rather than all of them. Based on the embodiments of the present disclosure, any other embodiments obtained by those of ordinary skill in the art shall fall in the protection scope of the present disclosure.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless otherwise clearly noted in the context.

It should be understood that, although the terms "first", "second", "third" and the like may be adopted to describe "XYZ" in the embodiments of the present disclosure, but these XYZ should not be limited by these terms. These terms are merely for distinguishing the XYZs from each other. For example, within the scope of the embodiments of the present disclosure, a first XYZ may also be called as a second XYZ; similarly, a second XYZ may also be called as a first XYZ.

Figure 1:
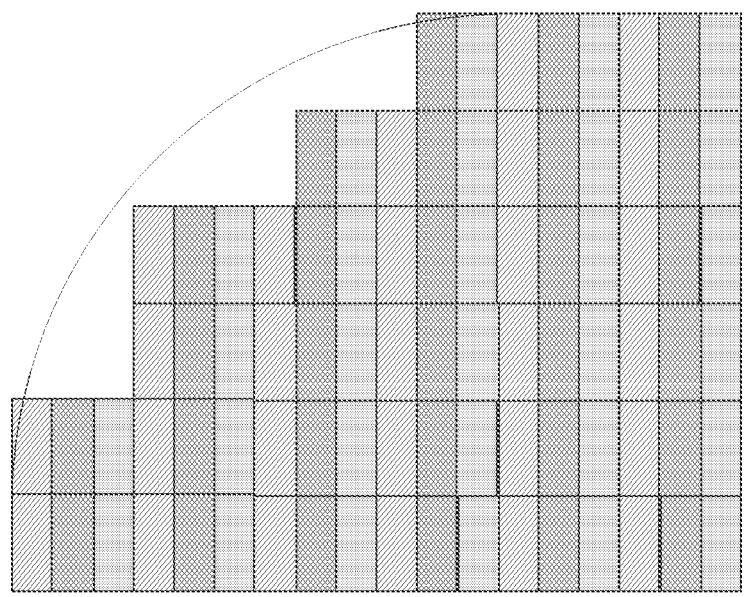
FIG. 1 illustrates a schematic diagram of an edge of a special-shaped area of a display panel in the conventional art.

As shown in FIG. 1, FIG. 1 illustrates a top view of a special-shaped area of a display panel in the conventional art, since a complete pixel needs to be kept in the special-shaped area, some areas of the edge of the special-shaped area is not provide with any pixel therein, so that the edge of the special-shaped area will present an obvious zigzag configuration during the display process, which results in poor display quality of the display panel.

Figure 2:
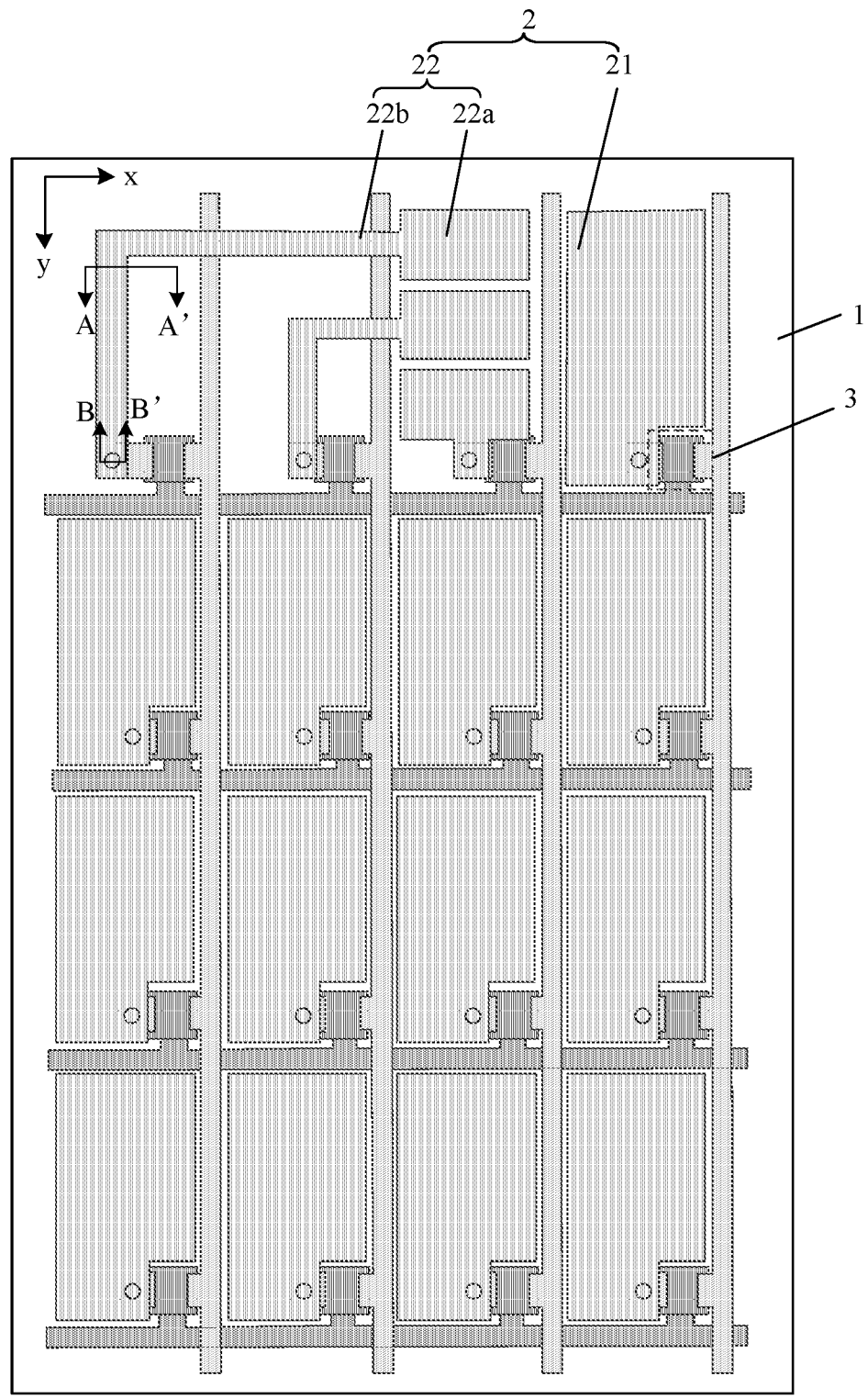
FIG. 2 illustrates a top view of a display panel according to an embodiment of the present disclosure.

A first aspect of the present disclosure provides a display panel. FIG. 2 illustrates a top view of a display panel according to an embodiment of the present disclosure. As shown in FIG. 2, the display panel includes a substrate 1, a plurality of pixel electrodes 2, and a plurality of thin-film transistors 3. The plurality of pixel electrodes 2 are placed on the substrate 1, and each pixel electrode 2 includes a plurality of first pixel electrodes 21 and at least three second pixel electrodes 22, i.e., there is a plurality of first pixel electrodes 21 and at least three second pixel electrodes 22 in the plurality of pixel electrodes 2. The second pixel electrode 22 is a compensation pixel electrode. An area of the substrate 1 occupied by each compensation pixel electrode is smaller than an area of the substrate 1 occupied by each first pixel electrode 21. The plurality of thin-film transistors 3 is placed on the substrate 2, is distributed in rows along a first direction x and in columns along a second direction y, and is electrically connected with the plurality of pixel electrodes 2 in one-to-one correspondence.

An orthographic projection of at least one second pixel electrode 22 on the substrate 1 does not overlap with an orthographic projection of the thin-film transistor 3 connected with the at least one second pixel electrode 22 on the substrate 1.

The second pixel electrodes 22 are compensation pixel electrodes, and an area of the substrate 1 occupied by each compensation pixel electrode is less than an area of the substrate 1 occupied by each first pixel electrode 21, so that the position of the special-shaped area which is not large enough for placing a complete pixel in the conventional art can be placed with a small and complete pixel consisting of a plurality of second pixel electrodes 22, which significantly decreases the area of the edge of special-shaped area without a pixel as compared with the conventional art, so as to alleviate the zigzag display configuration formed at the edge of the special-shaped area during display, thereby smoothening the edge of the special-shaped region and improving the display quality of the display panel. That is, the compensation pixel electrode is used instead of the first pixel electrode to be placed at the edge of the special-shaped area, so as to alleviate the above-mentioned zigzag display configuration. In addition, the thin-film transistors 3 on the substrate 1 are arranged in rows and columns, which is same as that of the existing thin-film transistor in the conventional art, thus, there is no need to change the arrangement of the thin-film transistors while the display quality of the display panel is improved, such that the production process of the display panel will not be influenced.

For example, the display panel above is a liquid crystal display panel, and the substrate 1 above is an array substrate. The display panel further includes a color film substrate arranged opposite to the array substrate, and a liquid crystal molecule layer filled between the array substrate and the color film substrate. Relevant configurations of the color film substrate and the liquid crystal molecule layer can be set with reference to the conventional art, which are not repeated herein.

Generally, the special-shaped area of a display panel is at the edge of the display panel, such as the arc special-shaped area shown in FIG. 1. Therefore, in the present disclosure, it is selected that, as shown in FIG. 2, an area on the substrate 1 occupied by each second pixel electrode 22 is defined as a first area A, an area on the substrate occupied by each first pixel is defined as a second area B, and the first area A is located at the edge of the second area B, for a clearer understanding of the technical solutions of the special-shaped area of the display panel in the embodiments of the present disclosure by those skilled in the art.

Optionally, as shown in FIG. 2, the second pixel electrode 22 includes a display portion 22a and a connection portion 22b. The display portion 22a and the connection portion 22b are placed in a same layer, and the display portion 22a is electrically connected with the thin-film transistor 3 by the connection portion 22b. When the display portion 22a of the second pixel electrode 22 is connected with the thin-film transistor 3 by the connection portion 22b, the connection portion 22b will not affect arrangement of other wirings of the display panel, and the production method and the driving method of the display panel will not be changed. Since the display portion 22a and the connection portion 22b are placed in a same layer, and the two portions can be formed at a same time, the production process of the display panel will not increase. For example, the connection portion 22b is strip-like. Optionally, in a direction perpendicular to the substrate 1, the connection portion 22b includes a plurality of linear segments, each of the linear segments includes at least one first segment extending along a first direction x and at least one second segment extending along a second direction y. It can be understood that the configuration of the second pixel electrode 22 is not limited herein which those skilled in art can select according to actual needs.

Figure 3:
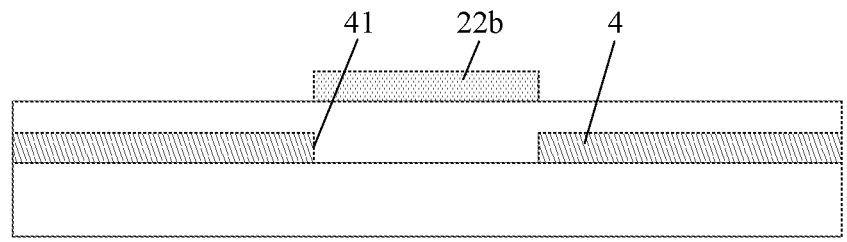
FIG. 3 illustrates a cross-sectional schematic diagram along direction A-A' shown in FIG. 2 according to an embodiment of the present disclosure.

Optionally, FIG. 3 illustrates a cross-sectional schematic diagram along direction A-A' shown in FIG. 2 according to an embodiment of the present disclosure. As shown in FIG. 3, the display panel further includes a common electrode 4 placed below the second pixel electrode 22, and an electric field is formed between the common electrode 4 and the second pixel electrode 22 to drive the liquid crystal molecules to deflect. When the second pixel electrode 22 has the configuration shown in FIG. 2, the common electrode selected in present embodiment of the present disclosure includes a hollow portion 41; in the electric field direction, the hollow portion 41 faces at least one connection portion 22b, which can effectively avoid an electric field from being formed between the common electrode 4 and the connection portion 22b of the second pixel electrode 22, and thus avoid the influence on deflection of the liquid crystal molecules corresponding to the display portion 22a due to the deflection of the liquid crystal molecules corresponding to the connection portion 22b, thereby facilitating normal deflection of the liquid crystal molecules corresponding to the display portion 22a and thus a normal display.

Further, as shown in FIG. 3, in the electric field direction, a projection of the hollow portion 41 overlaps with a projection of at least one connection portion 22b, which can make the area of the hollow portion 41 as small as possible, such that when no electric field is formed between the common electrode 4 and the connection portion 22b of the second pixel electrode 22, there is a maximum overlapping area between the common electrode and the display portion 22a of the second pixel electrode 22, so as to make all the liquid crystal molecules corresponding to the display portion 22a deflect under the action of the electric field, thereby achieving better display effect of the display panel.

The following embodiments of the present disclosure illustrate the connection manner in which a plurality of thin-film transistors 3 is electrically connected with a plurality of pixel electrodes 2 in one-to-one correspondence.

The connection manner of the first pixel electrode 21 and its corresponding thin-film transistor 3 can refer to the conventional art, for example, the thin-film transistor 3 is a bottom-gate type, which includes a gate electrode, an active layer, a source electrode, and a drain electrode. When a gate insulation layer is placed between the gate electrode and the active layer, the first pixel electrode 21 merely needs to be connected with the drain electrode of the thin-film transistor 3; when no insulation layer is placed between the gate electrode and the active layer, the first pixel electrode 21 and the drain electrode of the thin-film transistor 3 can be directly connected together by partly overlapping with each other; or, when a passivation layer is placed between the gate electrode and the active layer, the first pixel electrode 21 can be connected with the drain electrode of the thin-film transistor 3 through a through hole defined in the passivation layer.

The connection manner of the second pixel electrode 22 and its corresponding thin film transistor 3 can be various, and will be exemplarily illustrated as follows.

Figure 4:
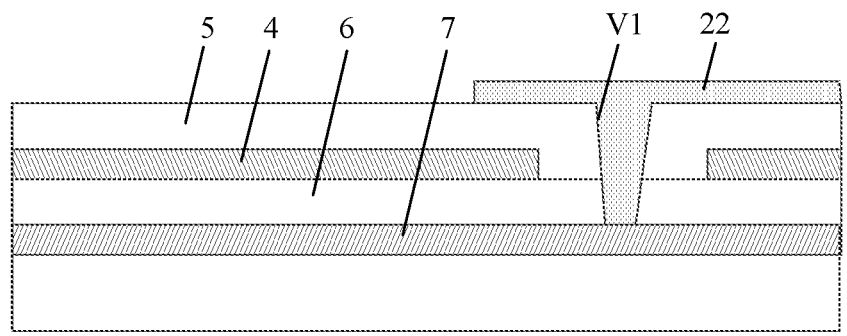
FIG. 4 illustrates a first cross-sectional schematic diagram along direction B-B' shown in FIG. 2 according to an embodiment of the present disclosure.

Optionally, as shown in FIG. 4, a first cross-sectional schematic diagram along direction B-B' shown in FIG. 2 according to an embodiment of the present disclosure, the display panel further includes a first insulation layer 5, a common electrode 4, a planarization layer 6 and a second metal layer 7, and the first insulation layer 5, the common electrode 4, the planarization layer 6, and the second metal layer 7 are all successively arranged below the second pixel electrode 22. The second metal layer 7 is electrically connected with the thin-film transistor 3, and a first through hole V1 is defined through each of the first insulation layer 5, the common electrode 4, and the planarization layer 6, and the second pixel electrode 22 is electrically connected with the second metal layer 7 through the first through holes V1.

For example, the second metal layer 7 is a source-drain metal layer, the drain electrode of the thin-film transistor 3 and the second metal layer 7 are arranged in a same layer, and the drain electrode of the thin-film transistor 3 is directly connected with the second metal layer 7.

Figure 5:
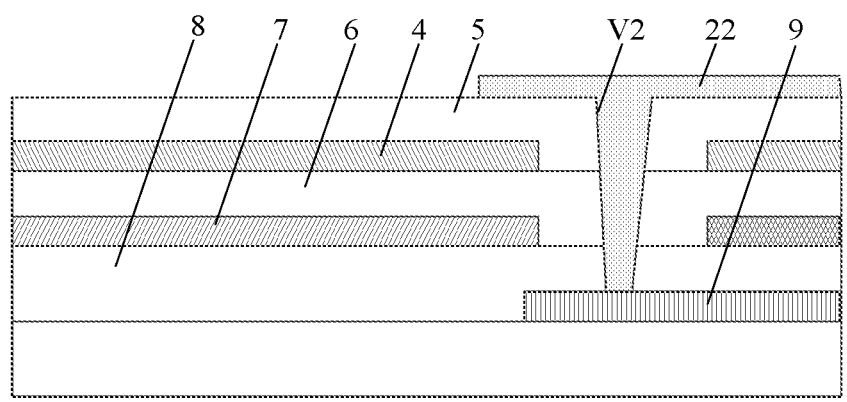
FIG. 5 illustrates a second cross-sectional schematic diagram along direction B-B' shown in FIG. 2 according to an embodiment of the present disclosure.

Optionally, as shown in FIG. 5, a second cross-sectional schematic diagram along direction B-B' shown in FIG. 2 according to an embodiment of the present disclosure, the display panel further includes a first insulation layer 5, a common electrode 4, a planarization layer 6, a second metal layer 7, a second insulation layer 8, and a first metal layer 9, and the first insulation layer 5, the common electrode 4, the planarization layer 6, the second metal layer 7, the second insulation layer 8, and the first metal layer 9 are successively arranged below the second pixel electrode 22. The first metal layer 9 is electrically connected with the thin-film transistor 3, a second through hole V2 is defined through each of the first insulation layer 5, the common electrode 4, the planarization layer 6, the second metal layer 7 and the second insulation layer 8, and the second pixel electrode 22 is electrically connected with the first metal layer 9 through the second through holes V2. For example, the first metal layer 9 is a gate metal layer, the second metal layer 7 is a source-drain metal layer, the drain electrode of the thin-film transistor 3 and the second metal layer are arranged in a same layer, the drain electrode of the thin-film transistor 3 is connected with the first metal layer 9 through the through hole defined in the second insulation layer 8.

Figure 6:
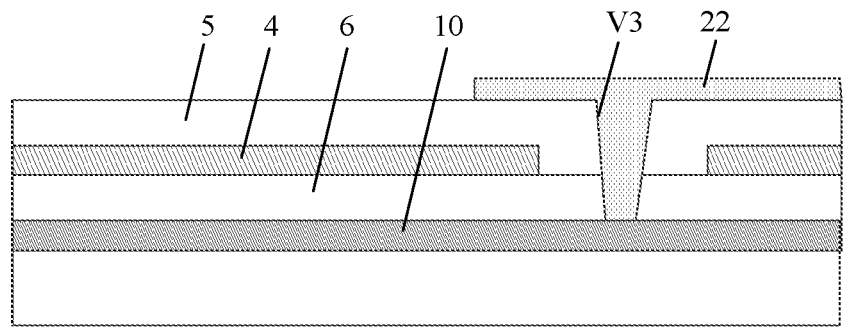
FIG. 6 illustrates a third cross-sectional schematic diagram along direction B-B' shown in FIG. 2 according to an embodiment of the present disclosure.

Optionally, as shown in FIG. 6, a third cross-sectional schematic diagram along direction B-B' shown in FIG. 2 according to an embodiment of the present disclosure, the display panel further includes a first insulation layer 5, a common electrode 4, a planarization layer 6, and a third metal layer 10, and the first insulation layer 5, the common electrode 4, the planarization layer 6, and the third metal layer 10 are successively arranged below the second pixel electrode 22. The third metal layer 10 is electrically connected with the thin-film transistor 3, and a third through hole V3 is defined through each of the first insulation layer 5, the common electrode 4, and the planarization layer 6, and the second pixel electrode 22 is electrically connected with the third metal layer 10 through the third through holes V3. For example, the third metal layer 10 is a touch metal layer, and a specific connection manner of the drain electrode of the thin-film transistor 3 and the third metal layer 10 can be selected according to a position relation between the film layer in which the drain electrode of the thin-film transistor 3 is located and the third metal layer 10, which is not limited herein.

In addition, the area without a pixel at the edge of the special-shaped area of the display panel in the conventional art have various shapes and sizes. In order to facilitate understanding and implementation of the present disclosure by those skilled in the art, the arrangement manner of each second pixel electrode 22 in one pixel consisting of a plurality of second pixel electrodes 22 and the size and shape of a suitable area therefor will be illustrated as follows.

Figure 7:
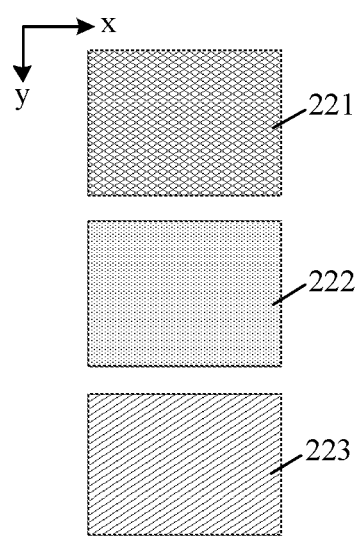
FIG. 7 illustrates a first top view of a pixel consisting of a plurality of second pixel electrodes according to an embodiment of the present disclosure.
Figure 8:
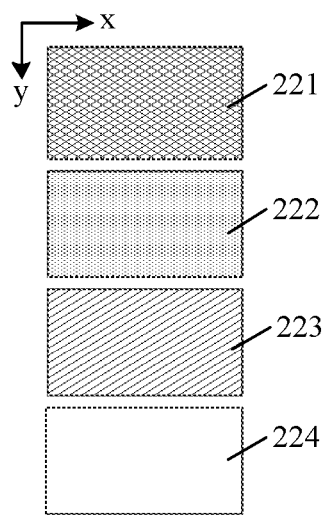
FIG. 8 illustrates a second top view of a pixel consisting of a plurality of second pixel electrodes according to an embodiment of the present disclosure.

FIG. 7 illustrates a first top view of a pixel consisting of a plurality of second pixel electrodes according to an embodiment of the present disclosure; and FIG. 8 illustrates a second top view of a pixel consisting of a plurality of second pixel electrodes according to an embodiment of the present disclosure. Optionally, as shown in FIGS. 7 and 8, the second pixel electrodes 22 form at least one pixel, an in the at least one pixel, all the second pixel electrodes 22 are distributed along the first direction x or along the second direction y.

For example, as shown in FIG. 7, in the at least one pixel, the number of the second pixel electrode 22 is three, and the three second pixel electrodes 22 are arranged along the second direction y. The connection manner between the three second pixel electrodes 22 and the thin-film transistor 3 in FIG. 7 can refer to FIG. 2. As shown in FIG. 2, the three second pixel electrodes 22 are connected with three thin-film transistors 3, respectively, and the three thin-film transistors 3 are respectively located in three pixels areas, each of the three pixels areas is defined by gate lines and data lines. Optionally, the three second pixel electrodes 22 include a red pixel electrode, a green pixel electrode, and a blue pixel electrode, which form a complete pixel. At this time, the size of each second pixel electrode 22 in the first direction x can be the same as the size of the first pixel electrode 21 in the first direction x, and the size of each second pixel electrode 22 in the second direction y can be about ⅓ of the size of the first pixel electrode 21 in the second direction y. Such an arrangement manner is more suitable for an area at the edge of the special-shaped area in the conventional art, which has no pixel but has similar size and shape with one first pixel electrode 21.

For example, as shown in FIG. 8, in each of at least one pixel, the number of the second pixel electrode 22 is four, and the four second pixel electrodes 22 are arranged along the second direction y. Optionally, the four second pixel electrodes 22 include a red pixel electrode, a green pixel electrode, a blue pixel electrode, and a white pixel electrode, which form a complete pixel. At this time, the size of each second pixel electrode 22 in the first direction x can be the same as the size of the first pixel electrode 21 in the first direction x, and the size of each second pixel electrode 22 in the second direction y can be about ¼ of the size of the first pixel electrode 21 in the second direction y. Such an arrangement manner is more suitable for an area at the edge of the special-shaped area in the conventional art, which has no pixel but has similar size and shape with one first pixel electrode 21. Compared with the solution shown in FIG. 7, a white pixel electrode is added in the solution shown in FIG. 8, which can further improve the brightness of the display panel.

Figure 9:
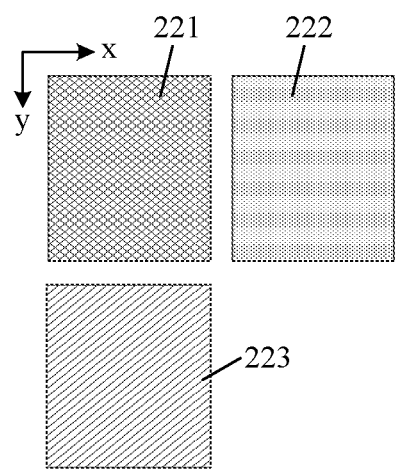
FIG. 9 illustrates a third top view of a pixel consisting of a plurality of second pixel electrodes according to an embodiment of the present disclosure.
Figure 10:
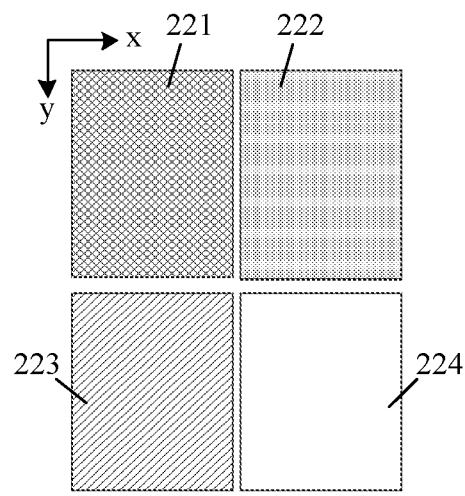
FIG. 10 illustrates a fourth top view of a pixel consisting of a plurality of second pixel electrodes according to an embodiment of the present disclosure.
Figure 11:
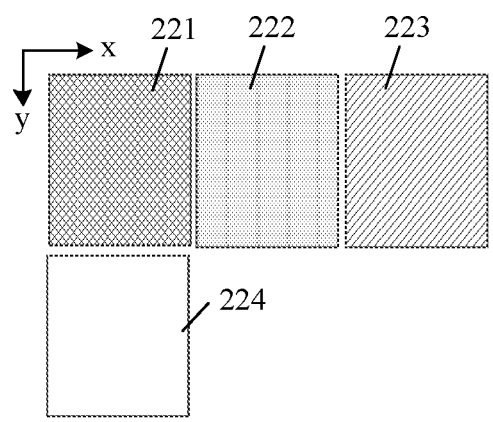
FIG. 11 illustrates top view V of a pixel consisting of a plurality of second pixel electrodes according to an embodiment of the present disclosure.

FIG. 9 illustrates a third top view of a pixel consisting of a plurality of second pixel electrodes according to an embodiment of the present disclosure; FIG. 10 illustrates a fourth top view of a pixel consisting of a plurality of second pixel electrodes according to an embodiment of the present disclosure; and FIG. 11 illustrates a fifth top view of a pixel consisting of a plurality of second pixel electrodes according to an embodiment of the present disclosure. Optionally, as shown in FIGS. 9-11, the plurality of second pixel electrodes 22 forms at least one pixel, and in each of the at least one pixel, all the second pixel electrodes 22 are distributed in row along the first direction x and in column along the second direction y.

Figure 12:
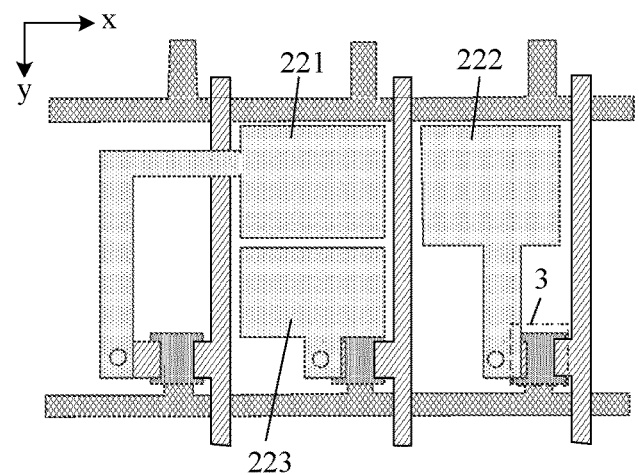
FIG. 12 illustrates a schematic diagram showing connection between the plurality of second pixel electrodes shown in FIG. 9 and a thin-film transistor according to an embodiment of the present disclosure.

For example, as shown in FIG. 9, in each of at least one pixel, the number of the second pixel electrode 22 is three, and the three second pixel electrodes 22 include a first sub-pixel electrode 221, a second sub-pixel electrode 222, and a third sub-pixel electrode 223. The first sub-pixel electrode 221 and the second sub-pixel electrode 222 are distributed along the first direction x, and the third sub-pixel electrode 223 and the first sub-pixel electrode 221 are distributed in the second direction y. FIG. 12 illustrates a schematic diagram showing connection between the plurality of second pixel electrodes shown in FIG. 9 and a thin-film transistor according to an embodiment of the present disclosure. The connection manner between the three sub-pixel electrodes and the thin-film transistor 3 is as shown in FIG. 12. The first sub-pixel electrode 221 and the second sub-pixel electrode 222 are directly connected with two thin-film transistors 3. The expression "directly connected" herein means that: the first sub-pixel electrode 221 and the second sub-pixel electrode 222 are connected with one corresponding thin-film transistor 3 placed in one pixel area in which the first sub-pixel electrode 221 and the second sub-pixel electrode 222 are located, the pixel area is an area defined by gate lines and data lines, and the third sub-pixel electrode 223 is connected with another thin-film transistor 3 in other pixel area. Optionally, the first sub-pixel electrode 221 is a red pixel electrode, the second sub-pixel electrode 222 is a green pixel electrode, the third sub-pixel electrode 223, is a blue pixel electrode, and the three electrodes form a complete pixel. At this time, the size of each of the first sub-pixel electrode 221, the second sub-pixel electrode 222 and the third sub-pixel electrode 223 in the first direction x can be the same as the size of the first pixel electrode 21 in the first direction x, and the size of each of the first sub-pixel electrode 221, the second sub-pixel electrode 222 and the third sub-pixel electrode 223 in the second direction y can be about ½ of the size of the first pixel electrode 21 in the second direction y. Such an arrangement manner is more suitable for an area at the edge of the special-shaped area in the conventional art, which has no pixel but has similar size and shape with an overall size and shape of two first pixel electrodes 21.

For example, as shown in FIG. 10, in each of at least one pixel, the number of the second pixel electrode 22 is four, and the four second pixel electrodes 22 include a first sub-pixel electrode 221, a second sub-pixel electrode 222, a third sub-pixel electrode 223, and a fourth sub-pixel electrode 224. The first sub-pixel electrode 221 and the second sub-pixel electrode 222 are arranged along the first direction x, the third sub-pixel electrode 223 and the fourth sub-pixel electrode 224 are arranged along the first direction x, and the first sub-pixel electrode 221 and the third sub-pixel electrode 223 are arranged in the second direction y. Optionally, the first sub-pixel electrode 221 is a red pixel electrode, the second sub-pixel electrode 222 is a green pixel electrode, the third sub-pixel electrode 223 is a blue pixel electrode, the fourth sub-pixel electrode 224 is a white pixel electrode, and the four electrodes form a complete pixel. At this time, the size of each of the first sub-pixel electrode 221, the second sub-pixel electrode 222, the third sub-pixel electrode 223 and the fourth sub-pixel electrode 224 in the first direction x can be the same as the size of the first pixel electrode 21 in the first direction x, and the size of each of the first sub-pixel electrode 221, the second sub-pixel electrode 222, the third sub-pixel electrode 223 and the fourth sub-pixel electrode 224 in the second direction y can be about ½ of the size of the first pixel electrode 21 in the second direction y. Such an arrangement manner is more suitable for an area at the edge of the special-shaped area in the conventional art, which has no pixel but has similar size and shape with an overall size and shape of two first pixel electrodes 21. Compared with the solution shown in FIG. 9, a white pixel electrode is added in the solution shown in FIG. 10, which can further improve the brightness of the display panel.

For example, as shown in FIG. 11, in each of the at least one pixel, the number of the second pixel electrode 22 is four, and the four second pixel electrodes 22 include a first sub-pixel electrode 221, a second sub-pixel electrode 222, a third sub-pixel electrode 223, and a fourth sub-pixel electrode 224. The first sub-pixel electrode 221, the second sub-pixel electrode 222 and the third sub-pixel electrode 223 are arranged along the first direction x, and the fourth sub-pixel electrode 224 and the first sub-pixel electrode 221 are arranged along the second direction y. Optionally, the first sub-pixel electrode 221 is a red pixel electrode, the second sub-pixel electrode 222 is a green pixel electrode, the third sub-pixel electrode 223 is a blue pixel electrode, the fourth sub-pixel electrode 224 is a white pixel electrode, and the four electrodes form a complete pixel. At this time, the size of each of the first sub-pixel electrode 221, the second sub-pixel electrode 222, the third sub-pixel electrode 223 and the fourth sub-pixel electrode 224 in the first direction x can be about ⅓ of the size of the first pixel electrode 21 in the second direction y, and the size of each of the first sub-pixel electrode 221, the second sub-pixel electrode 222, the third sub-pixel electrode 223 and the fourth sub-pixel electrode 224 in the second direction y can be the same as the size of the first pixel electrode 21 in the first direction x.

Such an arrangement manner is more suitable for an area at the edge of the special-shaped area in the conventional art, which has no pixel but has similar size and shape with an overall size and shape of two first pixel electrodes 21 which have been rotated by 90°. A white pixel electrode is also added in the solution shown in FIG. 11, which can also further improve the brightness of the display panel.

Figure 13:
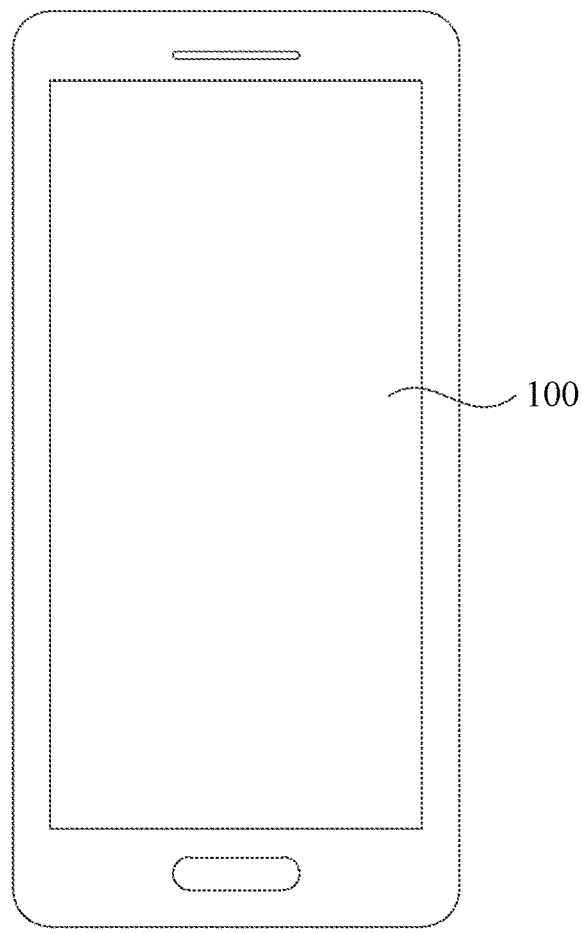
FIG. 13 illustrates a top view of a display device according to an embodiment of the present disclosure.

A second aspect of the present disclosure provides a display device, as shown in FIG. 13, which illustrates a top view of a display device according to an embodiment of the present disclosure. The display device includes the display panel 100 as described in any one of above embodiments of the present disclosure. The display device provided in the embodiment of the present disclosure can be any product or component with display function, such as smart phones, wearable smart watches, smart glasses, tablet computer, TV sets, display, laptop, digital photo frame, navigator, vehicle display, electrophoretic display, e-book, etc. The display panel and the display device in the embodiments of the present disclosure can be flexible or non-flexible, and the present disclosure has no limit thereon.

The technical solutions of the present disclosure can achieve the following beneficial effects:

Since the second pixel electrode 22 of the display panel is a compensation pixel electrode on the substrate 1, and an area of the substrate 1 occupied by each compensation pixel electrode is less than an area of the substrate 1 occupied by each first pixel electrode 21, so that the position of the special-shaped area which is not big enough for placing a complete pixel in the conventional art can be placed with a small and complete pixel consisting of a plurality of second pixel electrodes 22, which significantly decreases the area of the edge of special-shaped area without a pixel as compared with the conventional art, so as to alleviate the zigzag display configuration formed at the edge of the special-shaped area during display, thereby smoothening the edge of the special-shaped region and improving the display quality of the display panel. In addition, the thin-film transistors 3 on the substrate 1 are arranged in rows and columns, which is the same as that of the existing thin-film transistor of the art, thus, there is no change to the arrangement of the thin-film transistors while the display quality of the display panel is improved, such that the production process of the display panel will not be influenced.

The above are merely preferred embodiments of the present disclosure and are not intended to limit the present disclosure. For those skilled in the art, this present disclosure may have various modifications and changes. Any amendment, equivalent replacement, and improvement, etc. within the spirit and principles of the present disclosure shall fall into the protection scope of the present disclosure.

What is claimed is:

1. A display panel, comprising:
   a substrate;
   a plurality of pixel electrodes placed on the substrate, each pixel electrode comprising a plurality of first pixel electrodes and at least three second pixel electrodes; and
   a plurality of thin-film transistors arranged in rows in a first direction and in columns in a second direction on the substrate;
   wherein the at least three second pixel electrodes are compensation pixel electrodes, and an area of the substrate occupied by each compensation pixel electrode is smaller than an area of the substrate occupied by each first pixel electrode; and
   wherein the plurality of thin-film transistors is electrically connected with the plurality of pixel electrodes in one-to-one correspondence, and an orthographic projection of at least one of the at least three second pixel electrodes on the substrate does not overlap with an orthographic projection of at least one of the thin-film transistors correspondingly connected with the at least one of the at least three second pixel electrodes on the substrate.

2. The display panel according to claim 1, wherein an area of the substrate occupied by each second pixel electrode is defined as a first area, the area of the substrate occupied by each first pixel electrode is defined as a second area, and the first area is located at an edge of the second area.

3. The display panel according to claim 1, wherein each second pixel electrode comprises a display portion and a connection portion, the display portion and the connection portion are arranged in a same layer, and the display portion is electrically connected with the thin-film transistor by the connection portion.

4. The display panel according to claim 3, wherein the connection portion is shaped like a strip.

5. The display panel according to claim 3, further comprising a common electrode placed below the second pixel electrodes,
   wherein an electric field is formed between the common electrode and the second pixel electrodes; and
   wherein the common electrode has a hollow portion, and in a direction of the electric field, the hollow portion faces at least one of the connection portions.

6. The display panel according to claim 5, wherein in the direction of the electric field, a projection of the hollow portion overlaps with a projection of at least one of the connection portions.

7. The display panel according to claim 3, wherein in a direction perpendicular to the substrate, the connection portion comprises a plurality of linear segments, each of the linear segments comprises at least one first segment extending along the first direction and at least one second segment extending along the second direction.

8. The display panel according to claim 1, further comprising:
   a first insulation layer,
   a common electrode,
   a planarization layer, and
   a second metal layer,
   wherein the first insulation layer, the common electrode, the planarization layer, and the second metal layer are successively arranged below the second pixel electrodes; the second metal layer is electrically connected with the thin-film transistors, a first through hole is defined through each of the first insulation layer, the common electrode and the planarization layer, and the at least three second pixel electrodes are electrically connected with the second metal layer through the first through holes.

9. The display panel according to claim 1, further comprising:
   a first insulation layer,
   a common electrode,
   a planarization layer,
   a second metal layer,
   a second insulation layer, and
   a first metal layer;
   wherein the first insulation layer, the common electrode, the planarization layer, the second metal layer, the second insulation layer and the first metal layer are successively arranged below the second pixel electrodes, the first metal layer is electrically connected with the thin-film transistor, and a second through hole is defined through each of the first insulation layer, the common electrode, the planarization layer, the second metal layer and the second insulation layer, and the at least three second pixel electrodes are electrically connected with the first metal layer through the second through holes.

10. The display panel according to claim 1, further comprising:

a first insulation layer, a common electrode, a planarization layer, and a third metal layer;

wherein the first insulation layer, the common electrode, the planarization layer and the third metal layer are successively arranged below the second pixel electrodes, the third metal layer is electrically connected with the thin-film transistors, a third through hole is defined through each of the first insulation layer, the common electrode, and the planarization layer, and the at least three second pixel electrodes are electrically connected with the third metal layer through the third through holes.

11. The display panel according to claim 1, wherein the at least three second pixel electrodes form at least one pixel, and in each of the at least one pixel, all pixel electrodes are arranged along the first direction or along the second direction.

12. The display panel according to the claims 11, wherein in each of the at least one pixel, a number of the second pixel electrodes is three, and the three second pixel electrodes are arranged along the second direction.

13. The display panel according to claim 11, wherein in each of the at least one pixel, a number of the second pixel electrodes is four, and the four second pixel electrodes are arranged along the second direction.

14. The display panel according to claim 1, wherein the at least three second pixel electrodes forms at least one pixel, and in each of the at least one pixel, all of the second pixel electrodes are arranged in row along the first direction and in column along the second direction.

15. The display panel according to claim 14, wherein, in each of the at least one pixel, a number of the second pixel electrodes is three, and the three second pixel electrodes comprises a first sub-pixel electrode, a second sub-pixel electrode, and a third sub-pixel electrode;

the first sub-pixel electrode and the second sub-pixel electrode are arranged along the first direction, and are directly connected with two of the thin-film transistors, and the third sub-pixel electrode and the first sub-pixel electrode are arranged along the second direction.

16. The display panel according to claim 14, wherein, in each of at least one pixel, a number of the second pixel electrodes is four, and the four second pixel electrodes comprises a first sub-pixel electrode, a second sub-pixel electrode, a third sub-pixel electrode, and a fourth sub-pixel electrode;

the first sub-pixel electrode and the second sub-pixel electrode are arranged along the first direction, the third sub-pixel electrode and the fourth sub-pixel electrode are arranged along the first direction, and the first sub-pixel electrode and the third sub-pixel electrode are arranged along the second direction.

17. The display panel according to claim 14, wherein, in each of at least one pixel, a number of the second pixel electrodes is four, and the four second pixel electrodes comprises a first sub-pixel electrode, a second sub-pixel electrode, a third sub-pixel electrode, and a fourth sub-pixel electrode;

the first sub-pixel electrode, the second sub-pixel electrode, and the third sub-pixel electrode are arranged along the first direction, and the fourth sub-pixel electrode and the first sub-pixel electrode are arranged along the second direction.

18. A display device, comprising a display panel, wherein the display panel comprises:

a substrate;

a plurality of pixel electrodes placed on the substrate, each pixel electrode comprising a plurality of first pixel electrodes and at least three second pixel electrodes; and a plurality of thin-film transistors arranged in rows in a first direction and in columns in a second direction on the substrate;

wherein the at least three second pixel electrodes are compensation pixel electrodes, and an area of the substrate occupied by each compensation pixel electrode is smaller than an area of the substrate occupied by each first pixel electrode; and wherein the plurality of thin-film transistors is electrically connected with the plurality of pixel electrodes in one-to-one correspondence, and an orthographic projection of at least one of the at least three second pixel electrodes on the substrate does not overlap with an orthographic projection of at least one of the thin-film transistors correspondingly connected with the at least one of the at least three second pixel electrodes on the substrate.

* * * * *